United States Patent [19]
Drabenstadt et al.

[11] Patent Number: 5,469,074
[45] Date of Patent: Nov. 21, 1995

[54] CHIP SOCKET TESTING APPARATUS WITH ADJUSTABLE CONTACT FORCE

[75] Inventors: William W. Drabenstadt, Camp Hill; Richard C. Fowler, East Berlin; Soren Grinderslev, Hummelstown, all of Pa.; Robert D. Irlbeck, Greensboro, N.C.

[73] Assignee: The Whitaker Corporation, Wilmington, Del.

[21] Appl. No.: 193,347

[22] Filed: Feb. 8, 1994

[51] Int. Cl.⁶ .............................. H01R 9/09; G01R 1/04
[52] U.S. Cl. .............................. 324/758; 439/68; 439/73; 439/83
[58] Field of Search .................................. 324/756–758; 439/67–74

[56] References Cited

U.S. PATENT DOCUMENTS

| | | | |
|---|---|---|---|
| 4,838,801 | 6/1989 | Bertoglio et al. | 439/83 |
| 4,969,828 | 11/1990 | Bright et al. | 439/68 |

Primary Examiner—Kenneth A. Wieder
Assistant Examiner—Barry C. Bowser
Attorney, Agent, or Firm—William B. Noll; Timothy J. Aberle

[57] ABSTRACT

The invention relates to testing apparatus, such as the type known as a burn-in test socket for integrated circuit "chips", where the chips are essentially planar electronic devices having a plurality of chip leads or traces, laterally projecting therefrom, for electrical interconnection to complementary traces on a planar electronic device, such as a mother board, upon which the socket may be mounted, during testing. The socket comprises a frame member for mounting to the planar electronic device, where the frame member includes electrical means for engaging chip leads and applying electrical current thereto during testing. A second element of the socket is a two-piece, adjustable cover member consisting of first and second members floatably mounted together by plural compression springs, where the first and second members are axially movable relative to one another. Specifically, the first member includes a force generating surface to apply a uniform force on the chip leads in contact with said complementary traces, while the second member, overlying the first member, includes at least a pair of latching members adapted to secure the cover member to the frame member during chip testing.

9 Claims, 3 Drawing Sheets

CHIP SOCKET TESTING APPARATUS WITH ADJUSTABLE CONTACT FORCE

RELATED APPLICATION

The present invention relates to socket testing apparatus, such as a burn-in test socket, for integrated circuit "chips", and represents an alternative approach to the invention disclosed and claimed in application, U.S. Ser. No. 08/081,769, filed Jun. 23, 1993, now abandoned, and assigned to the assignee hereof. More particularly, this invention is directed to a modified apparatus which includes an adjustable or floating contact force applying member.

BACKGROUND OF THE INVENTION

Experience has shown that the catastrophic failure of an integrated circuit chip, such as a microprocessor, will typically occur during the initial phase of the chip life. If the chip passes its initial operational phase, the life and reliability of the chip will have a relatively high probability.

In the case of a burn-in test socket, to precipitate early chip failure, the chip is "exercised" or powered while being subjected to relatively high external temperatures. Typically, a batch of chips is electrically powered in an oven where the temperature is maintained at approximately 150° C. for an extended period of time, such as 1,000 hours. This is referred to in the art as "burn-in".

During burn-in, a batch of chips may be mounted on a mother board, and the chip leads are electrically connected to respective circuit elements on the other board by a suitable means, such as one or more flexible electrical connectors. Maintaining good electrical contact between the chip leads and the flexible electrical connector is very important. Where the leads are gold plated, the electrical contact is usually not a major problem; but where the chip leads are tin plated, a relatively high retention force is necessary to assure good electrical contact. This is due to oxidation of the tin-plated chip leads. Even if the oven has a nitrogen atmosphere, it is still necessary to maintain a relatively-high clamping force to retain the chip frames and assure good electrical contact with the chip leads.

In order to assure a proper and sufficient retention force, especially where the chip leads are tin-plated, a system of levers or oversized latches are usually necessary in order to achieve the necessary mechanical advantage for the desired retention force. However, because of space problems, this is not feasible nor particularly desirable since it reduces the total number of chips on the board and thus reduces production rates.

For large batches of chips, the testing apparatus is fully automated and includes robotics arms for transferring the batches of chips into and out of the oven. In production, and because of the relatively large number of chips being burn-in, the prior clamping mechanisms interfered with the high-speed automated apparatus for transferring large batches of chips.

In accordance with prior art practices and practitioners, it was known that in order to achieve proper electrical contact, a force had to be applied between the two connecting surfaces. Further, it was important to maintain an optimal force range during the high temperature testing of the assembly. Normally, the socket is designed so that when the lid of the test socket is closed a constant force is applied. However, due to the often extensive mechanical tolerance build-up that can exist among the apparatus components, such as the latch, lid, pusher, device elements, and socket base, it was extremely difficult to determine the actual size of the applied force. This led to inaccurate or incomplete testing.

The copending application represents a major effort to overcome the shortcomings of the prior art. The invention thereof is directed to a burn-in socket testing apparatus and comprises a first frame member for mounting to a planar electronic board, such as a mother board, where such first frame member includes electrical means for engaging the chip leads or traces of the chip to be tested, and applying electrical current during burn-in. Above the first frame member is a second frame member disposed in sliding engagement therewith, where the second frame member is movable from a first position to a second position. Finally, cooperative latching and camming means are provided between the first and second frame members to effect the movement between the first and second positions, and to securely hold the chip during burn-in, where the camming means includes a pivotal member movable from a remote position free of the chip to a position engaging the chip.

The present invention teaches a spring loaded, floating cover member which eliminates most of the mechanical tolerance build-up which can be detrimental to the performance of this type of socket, particularly in the operation of a burn-in test socket. The unique features hereof will become apparent in the description which follows, particularly when read in conjunction with the accompanying drawings.

SUMMARY OF THE INVENTION

The present invention is directed to a test socket for integrated circuit "chips", where the chips are essentially planar electronic devices having a plurality of chips leads or traces extending therefrom for electrical interconnection to complementary traces on a planar electronic board, such as a mother board, upon which the socket may be mounted. The socket comprises a frame member for mounting to the planar electronic board, where the frame member may include electrical means for engaging the chip leads to apply electrical current thereto during burn-in. A second component thereof is a two-piece, adjustable cover member consisting of first and second members floatable mounted together by plural compression springs, where such members are axially movable relative to one another. The first member includes a force generating surface to apply a uniform force on the chip leads in contact with said complementary traces, and the second member, overlying first member, includes at least a pair of latching members adapted to secure the cover member to the frame member during chip burn-in and testing.

DETAILED DESCRIPTION OF PREFERRED EMBODIMENT

This invention is directed to a test socket, preferably for burn-in testing purposes, for integrated circuit "chips" by the use of a spring loaded floating contact force applying member that eliminated most mechanical tolerance build-up which can detrimentally affect performance of the test socket.

Figure 1:
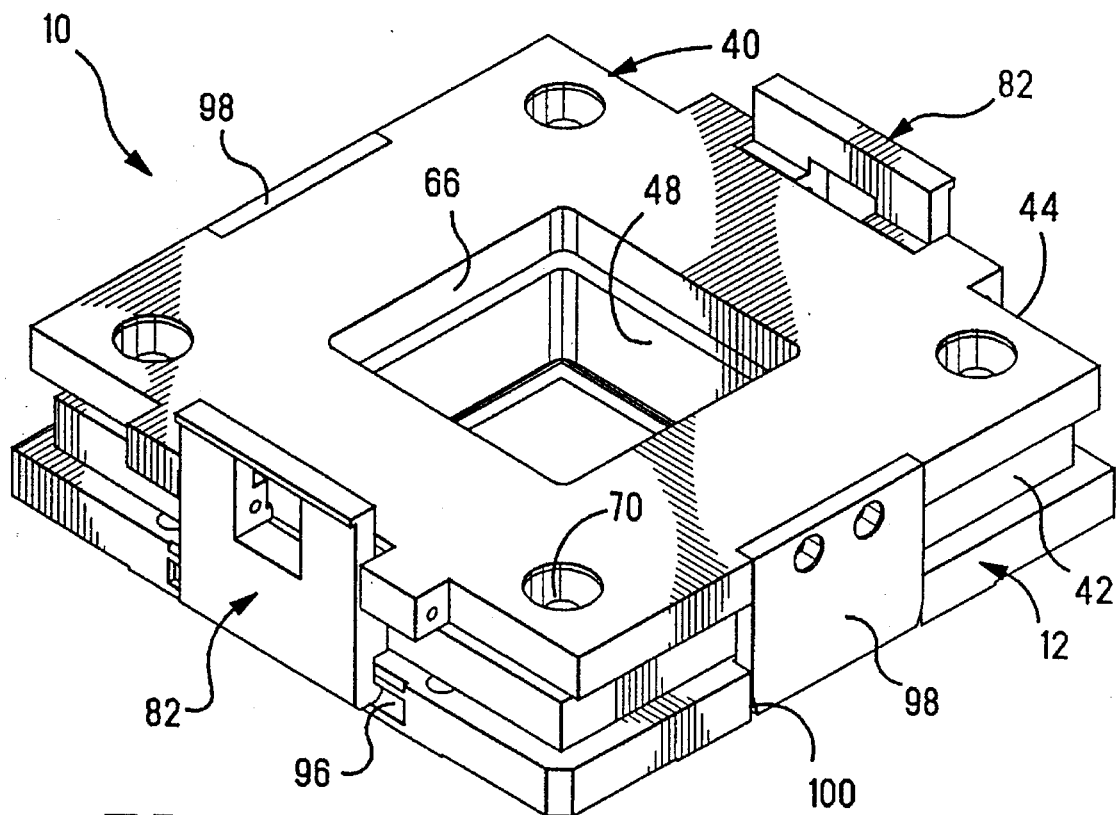
FIG. 1 is a perspective view of a test socket according to this invention, illustrating a chip receiving base member, and a two piece adjustable or floating contact force member, where the floating contact applying member includes a pair of latching arms engageable with said base member.
Figure 2:
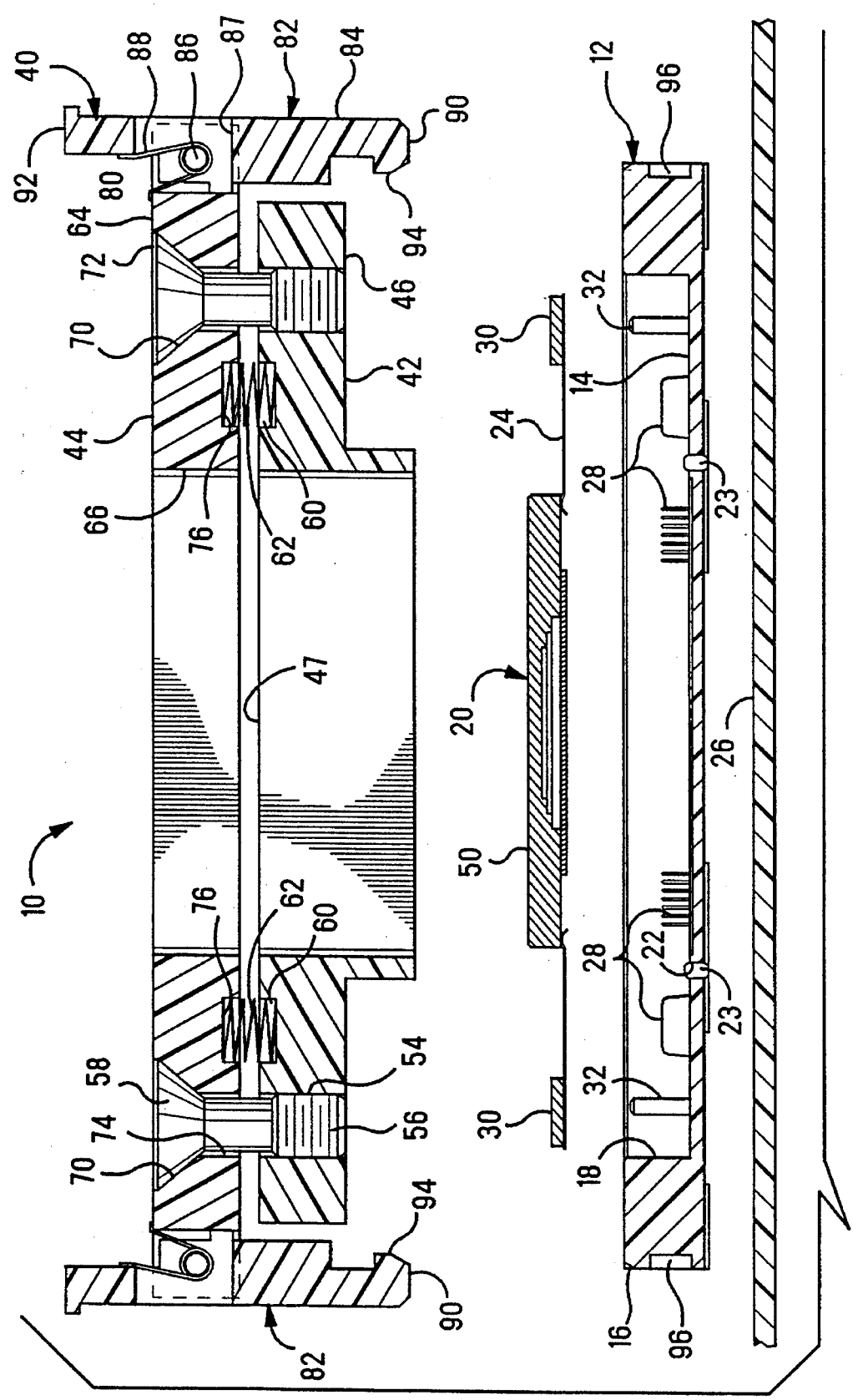
FIG. 2 is an exploded sectional view of the socket of FIG. 1, including a planar electronic device such as a printed circuit board, on which the socket is mounted.
Figure 3:
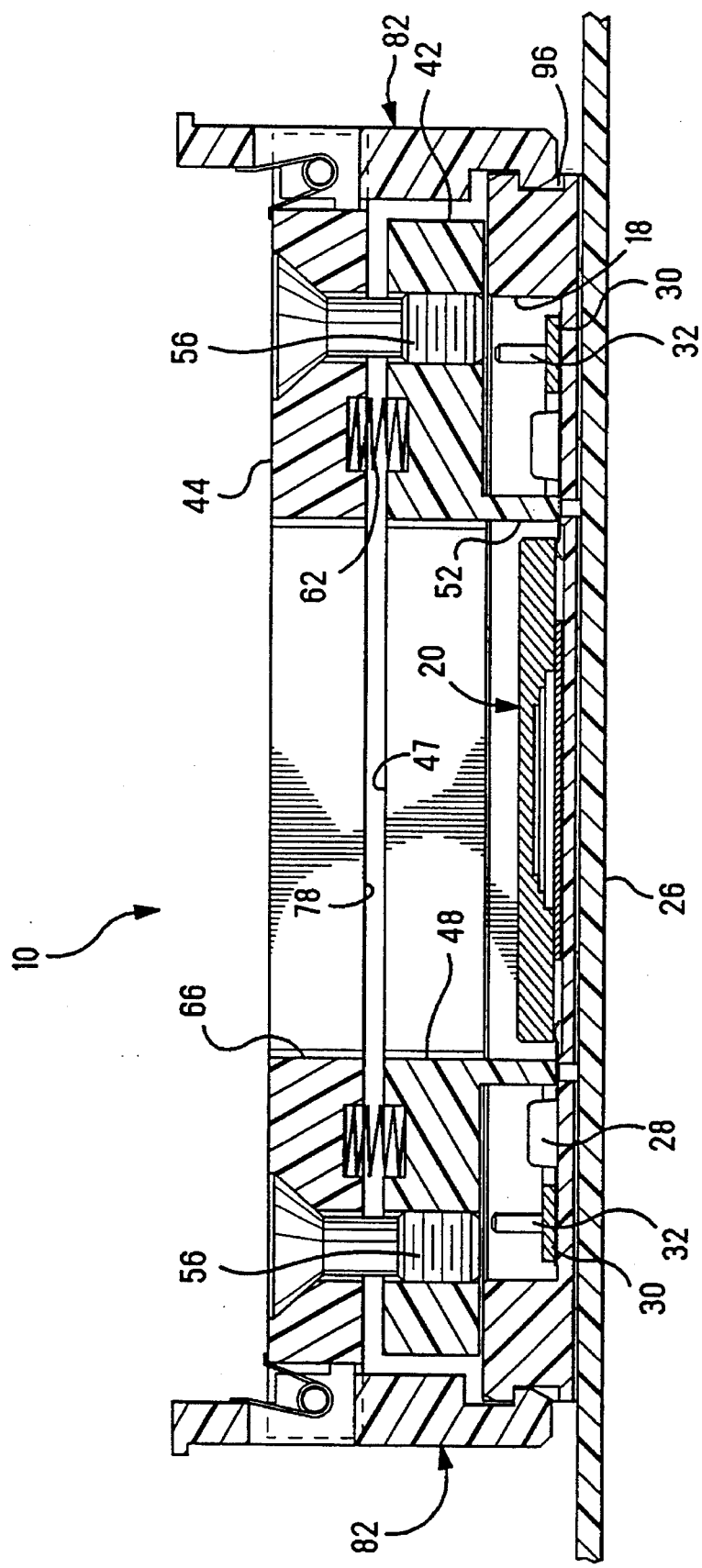
FIG. 3 is a sectional view of the assembled socket of FIG. 2.

FIGS. 1 to 3 illustrate the various components of the preferred test socket assembly 10 according to the invention. A first component thereof is a base member 12 consisting of an essentially continuous floor 14, and a peripheral wall 16 defining a central recess 18 for receiving therein the integrated circuit chip (chip) 20. Within said floor 14 are plural through slots or cavities 22 for receiving an elastomeric connector 23 for electrically engaging the chip leads 24 to corresponding electrical traces or pads, as known in the art, of a planar electronic device 26, such as a mother board, to which said base member 12 is mounted during testing of the chip 20, see FIG. 3. An elastomeric connector of the type contemplated herein is manufactures by AMP Incorporated, Harrisburg, Pa, under the trademark "AMPLIFLEX", a trademark owned by The Whitaker Corporation, Wilmington, Del., and licensed to AMP Incorporated. Such elastomeric connectors, intended for surface-to-surface interconnection requirements, consist of an elastomeric core having a thin plastic film thereabout, such as polyimide, where the film is typically provided with parallel lines of etched circuitry thereon for electrically interconnecting one device to another.

Projecting normal from the floor 14 into the recess 18 are a plurality of insulating spacers or combs 28 arranged to separate and lie between adjacent chip leads 24, where such leads are typically closely spaced and parallel, projecting out from the side of the chip 20. Further, to initially align the chip 20 on the floor 14, the chip lead 24, at the remote ends thereof, may be provided with a ceramic lead support 30. The ceramic lead support provides stability to a lead carrier strip, not shown, where the carrier strip, preferably at the respective carriers, may include post receiving holes which seat on the respective posts 32. After testing, the ceramic lead supports 30 are removed and the leads 24 formed as desired.

Overriding the base member 12 is the two-piece, adjustable, contact force member 40, consisting of a lower floating member 42 and an upper latching member 44. The lower floating member 42 includes a peripheral body portion 46 with an upper planar surface 47, and central opening 48 dimensioned to receive the chip body 50. Projecting downwardly from the body portion 46, preferably about the central opening 48, is a narrow, contact wall 52. Wherever such contact wall is placed, it will be seen in FIG. 3 that contact wall 52 applies a normal force to the chip leads 24 which overlie the elastomeric connectors 23, whereby electrical contact is made between said chip leads 24 and said planar electronic device 26.

About the body portion 46 a plurality of threaded through holes 54 are provided. As best seen in FIGS. 2 and 3, the through holes 54 receive a threaded fastener 56 having a flat, tapered head 58. It will be apparent from the discussion which follows that the fastener 56 retains the respective upper and lower members 42, 44 in a floating manner, yet a position of close proximity.

In addition to the through holes 54, the body portion 46 is further provided with plural recesses 60 into which are seated complementary coil springs 62. Such springs are under compression so that their functions are to maintain a spaced-apart relationship between the upper and lower members 42, 44, while individually allowing for adjustments between such members.

The upper member 44 comprises a planar body portion 64, essentially rectangular in configuration, having a central opening 66 corresponding to the central opening 48 in the lower member 42. Like the complementary lower member 42, the planar body portion 64 includes a plurality of holes 68, having a tapered entry 70 from the upper surface 72 thereof, where each such hole 68 is aligned with a corresponding threaded through hole 54 in the lower member 42. However, one distinction thereover is the fact that holes 68 are not threaded but rather slidable engage the fastener 56. That is, there is a small annular gap 74 between the fastener 56 and the hole 68. However, by the use of a fastener 56 having a tapered head 58 seated within the tapered entry 70, a predetermined maximum axial separation between the upper and lower members 42, 44 is assured.

Since the upper member 44 is arranged in floating relationship to the lower member 42, and the normal operating positions of such members are spaced-apart, plural recesses 76 are positioned about the lower surface 78, each aligned with a corresponding recess 60, to receive the compression coil springs 62. By this arrangement, the coil springs 62, under compression, act to separate the respective upper and lower members 42, 44, up to the limit caused by the interaction of the tapered head 58 and tapered entry 70.

Positioned along the outer edge 80 of the upper member 44 are a plurality of latching mechanisms 82, preferably a pair of such mechanisms on opposite sides of the upper member, see FIG. 1. The latching mechanism 82 includes a pivotal arm 84 having a laterally disposed post 86 within a cavity 87 receiving about said post a coiled biasing spring 88, a latching end 90, and a release or disengaging end 92. The latching end 90 is characterized by a latching shoulder 94 which is intended to be received in and engage the recess 96 about the periphery of base member 12. Additionally, as seen in FIG. 1, a pair of alignment members 98, molded or fastened to upper member 44, may be provided. Such members project downwardly and seat in corresponding slots 100 within the base member 12. This will assure proper alignment of the two-piece contact force member 40 with the base member 12.

Figure 4:
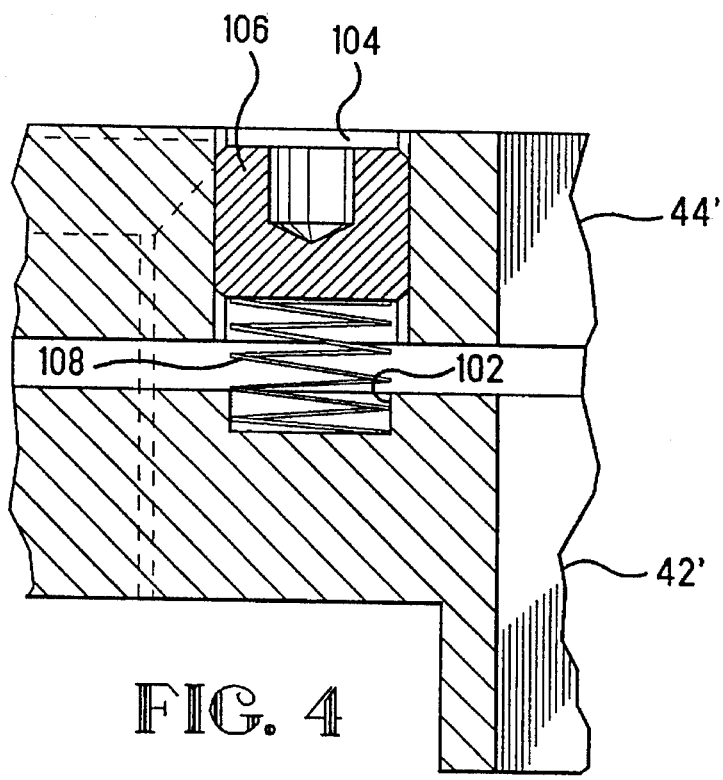
FIG. 4 is a partial sectional view of a modified spring assembly for mounting between the respective components of the adjustable or floating contact force member.

Finally, FIG. 4 illustrates an alternate manner to floatably mount the upper and lower members 42',44'. While the lower member 42' includes a coiled spring receiving recess 102, as noted in FIGS. 2 and 3, the upper member 44' is provided with a threaded through hole 104 and a threaded insert 106 therein. By this arrangement, in threading the insert to raise or lower the insert, one cannot only floatably mount the respective members, one call change the compressive force of the coiled spring 108.

We claim:

1. An electrical test socket assembly for testing electrical circuits, comprising:

a contact force member comprising an upper latching member and a lower floating member which is mounted to said upper latching member by at least one fastener but is movable relative to said upper latching member, said contact force member further includes at least one spring disposed between said upper latching member and said lower floating member;

a base member for mountably receiving said contact force member;

and said upper latching member further includes a body portion which comprises a top side of said upper latching member in a direction away from said base member, said top side includes a fastener aperture formed therein for receiving said fastener, whereby an operator can manipulate said fastener when said contact force member has been mounted on said base member in a closed position.

2. The socket assembly of claim 1, wherein said contact force member comprises a plurality of springs.

3. The socket assembly of claim 1, wherein said contact force member comprises a plurality of fasteners.

4. The socket assembly of claim 1, wherein said contact force member comprises a plurality of fasteners and a plurality of springs.

5. The socket assembly of claim 1, wherein said contact force member comprises a central opening which extends therethrough.

6. The socket assembly of claim 5, wherein said central opening comprises a contact wall therearound for engaging conductive portions formed on said electrical circuit.

7. The socket assembly of claim 1, wherein said base member comprises elastomeric electrical components for engaging conductive portions formed on said electrical circuit.

8. The socket assembly of claim 1, wherein said fastener aperture comprises a counter-sunk hole, and a generally annular gap around said fastener when said fastener is inserted into said fastener aperture.

9. The socket assembly of claim 1, wherein said fastener is generally fixedly connected to said lower floating member, and is movable relative to said upper latching member.

* * * * *